United States Patent
Wang et al.

(10) Patent No.: US 10,468,481 B2
(45) Date of Patent: Nov. 5, 2019

(54) SELF-ALIGNED SINGLE DIFFUSION BREAK ISOLATION WITH REDUCTION OF STRAIN LOSS

(71) Applicant: GLOBALFOUNDRIES INC., Grand Cayman (KY)

(72) Inventors: Haiting Wang, Clifton Park, NY (US); Hui Zang, Guilderland, NY (US); Chun Yu Wong, Ballston Lake, NY (US); Kwan-Yong Lim, San Diego, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/875,132

(22) Filed: Jan. 19, 2018

(65) Prior Publication Data
US 2019/0229183 A1    Jul. 25, 2019

(51) Int. Cl.
*H01L 29/06*    (2006.01)
*H01L 21/762*   (2006.01)
*H01L 27/088*   (2006.01)

(52) U.S. Cl.
CPC .... *H01L 29/0649* (2013.01); *H01L 21/76202* (2013.01); *H01L 21/76224* (2013.01); *H01L 27/0886* (2013.01)

(58) Field of Classification Search
CPC ............ H01L 29/0649; H01L 27/0886; H01L 21/76202; H01L 21/76224
See application file for complete search history.

(56) References Cited

U.S. PATENT DOCUMENTS

| 8,846,491 | B1 | 9/2014 | Pham et al. |
| 8,916,460 | B1 | 12/2014 | Pham et al. |
| 2014/0117454 | A1 | 5/2014 | Lin et al. |
| 2016/0247728 | A1* | 8/2016 | You ................ H01L 21/823821 |

* cited by examiner

*Primary Examiner* — Thanh Y. Tran
(74) *Attorney, Agent, or Firm* — Francois Pagette; Hoffman Warnick LLC

(57) ABSTRACT

A methodology for forming a single diffusion break structure in a FinFET device involves localized, in situ oxidation of a portion of a semiconductor fin. Fin oxidation within a fin cut region may be preceded by the formation of epitaxial source/drain regions over the fin, as well as by a gate cut module, where portions of a sacrificial gate that straddle the fin are replaced by an isolation layer. Localized oxidation of the fin enables the stress state in adjacent, un-oxidized portions of the fin to be retained, which may beneficially impact carrier mobility and hence conductivity within channel portions of the fin.

10 Claims, 11 Drawing Sheets

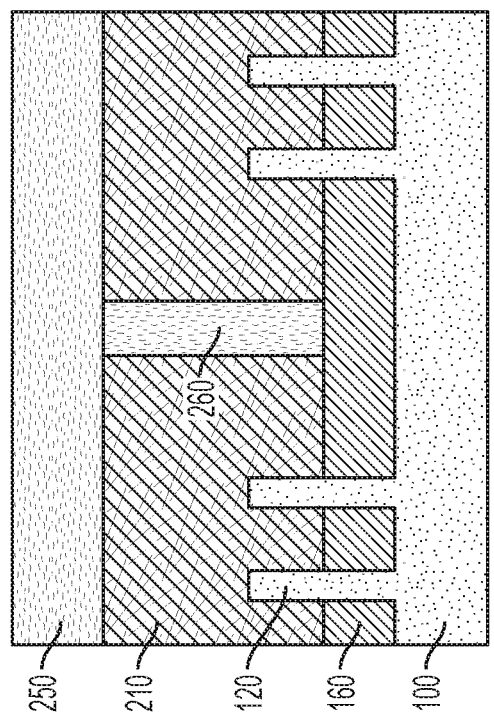
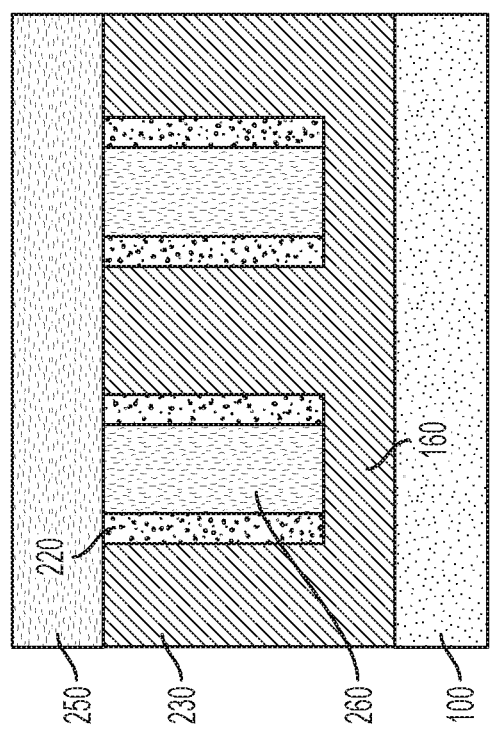
FIG. 4A
FIG. 4B

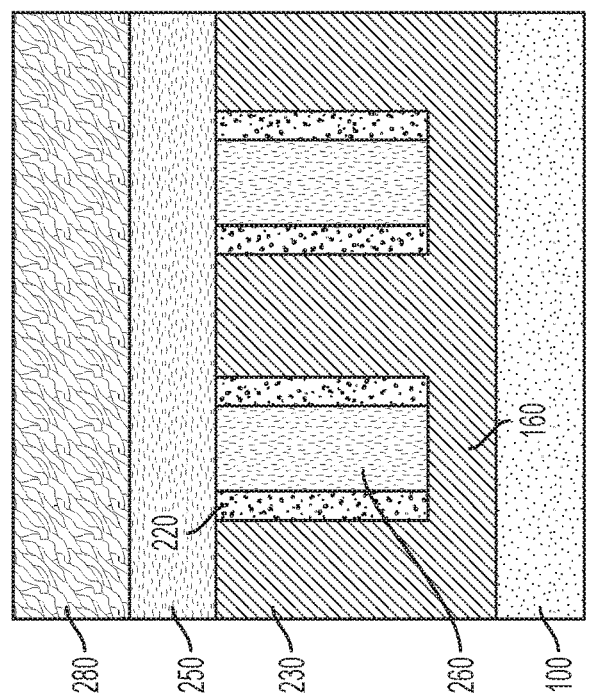
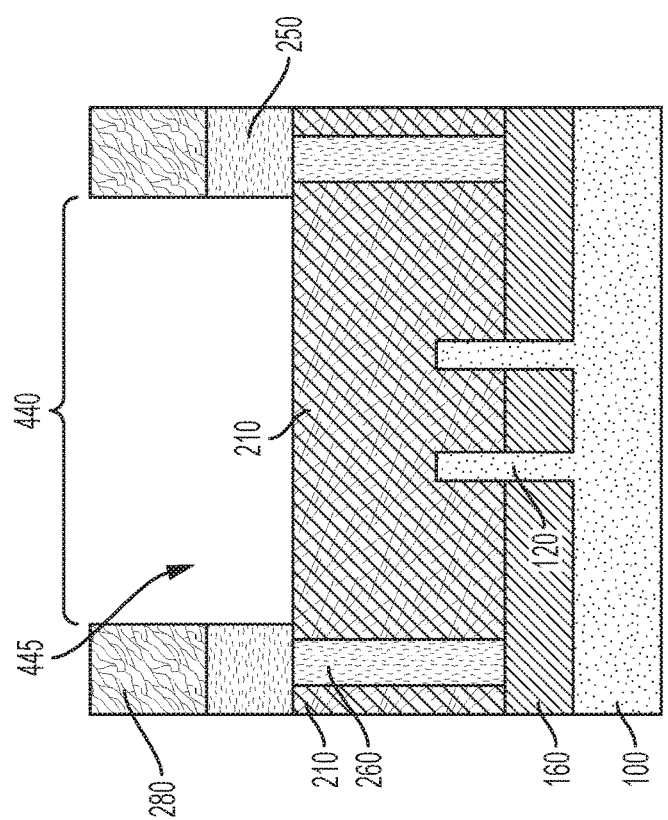

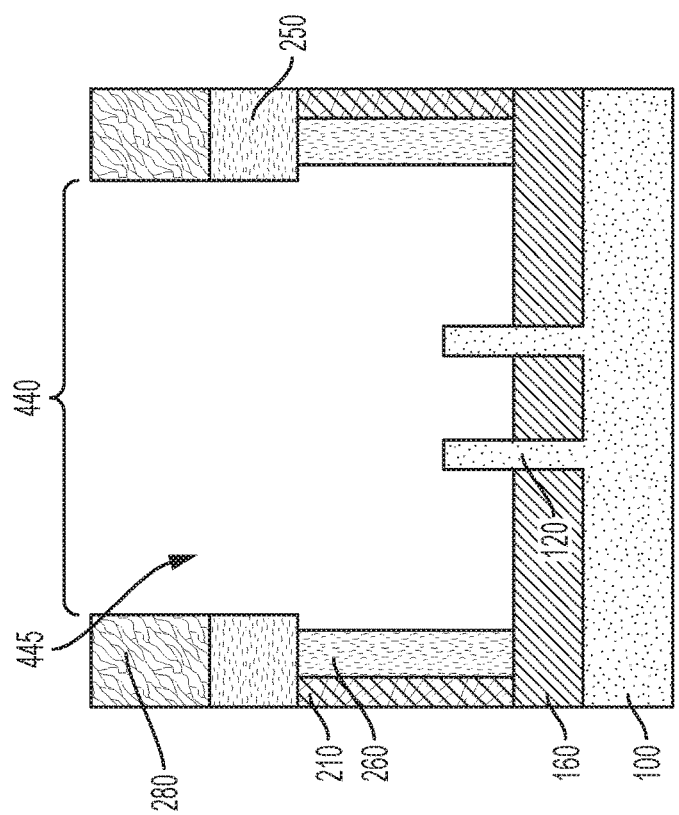
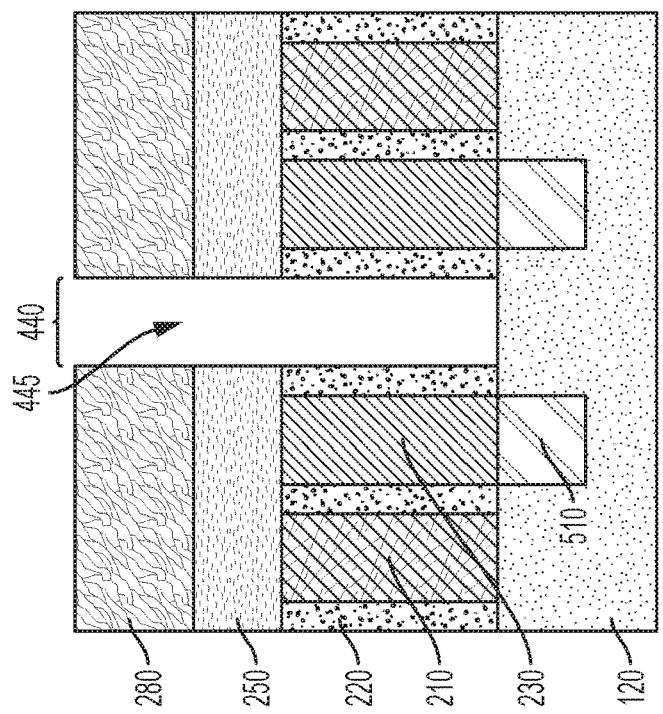

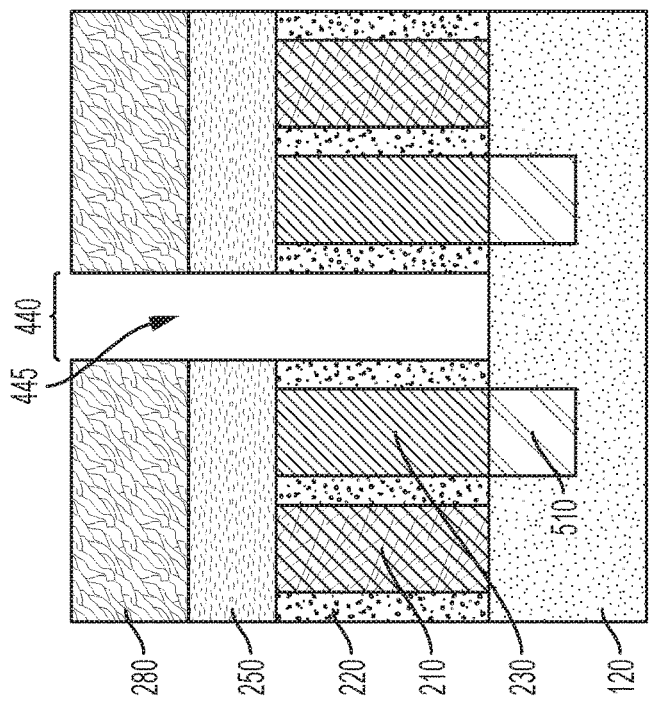
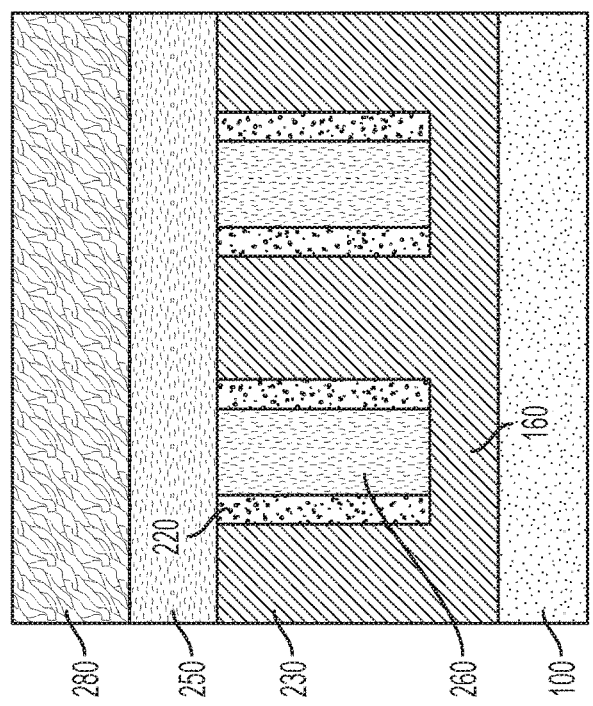
FIG. 7B
FIG. 7A

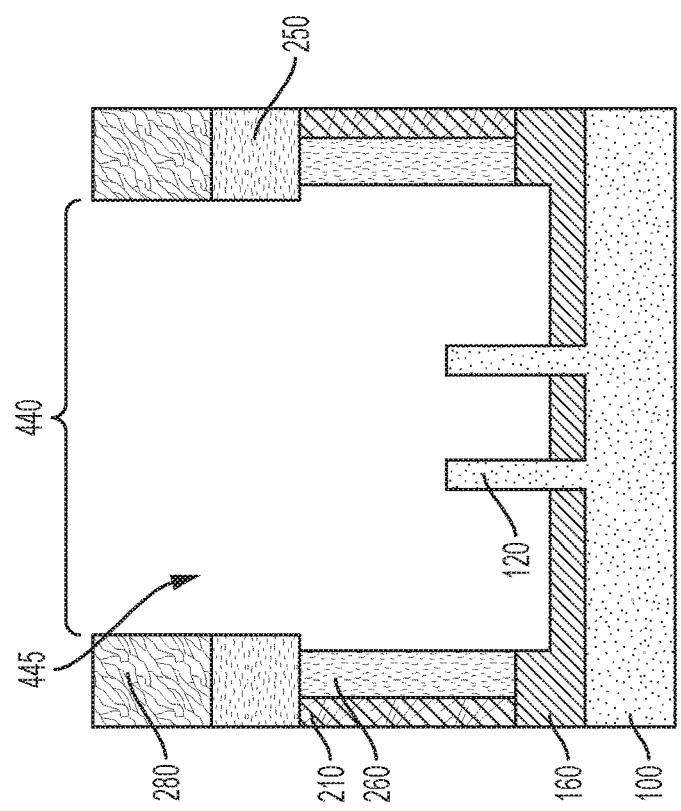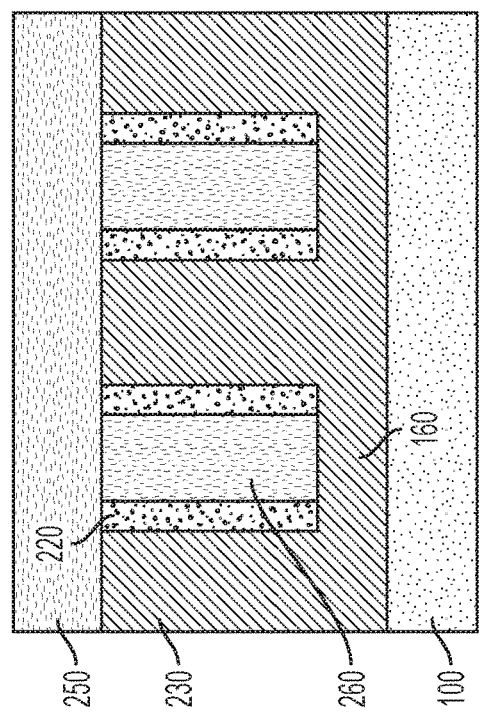

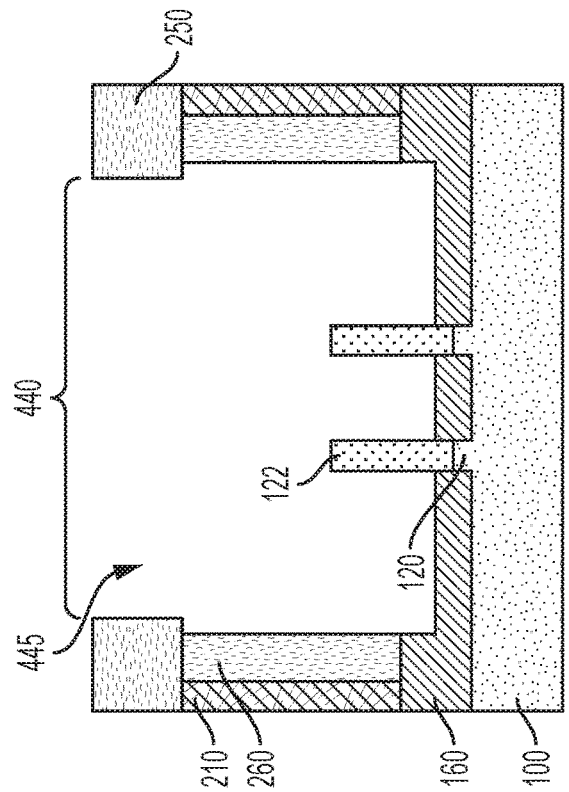
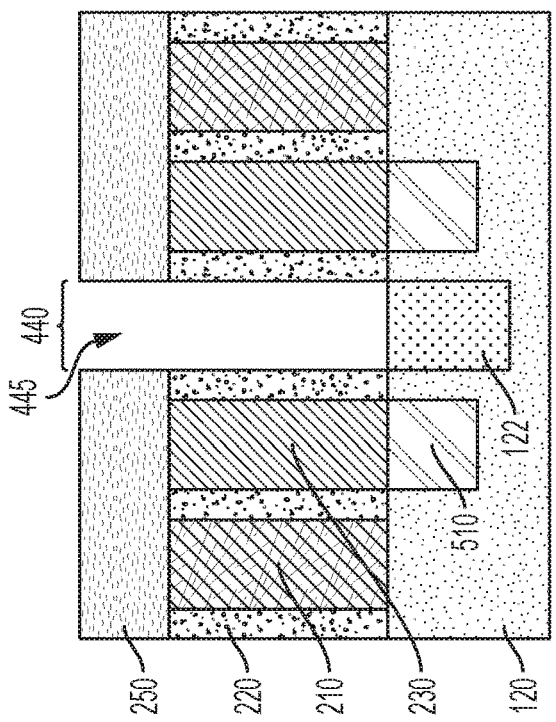
FIG. 8C
FIG. 8B

SELF-ALIGNED SINGLE DIFFUSION BREAK ISOLATION WITH REDUCTION OF STRAIN LOSS

BACKGROUND

The present application relates generally to semiconductor devices, and more specifically to methods for manufacturing fin field effect transistors.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture over a channel region.

In a FinFET device, the raised fin architecture allows the channel to be extended vertically thereby increasing its cross-sectional area, which beneficially allows higher current flow through the channel without increasing the areal dimensions of the device. Another way to enable higher current without increasing the device footprint is to induce strain in the channel. As known to those skilled in the art, a compressive strain increases charge carrier mobility in a p-type metal oxide semiconductor field effect transistor (PMOS) channel, while a tensile strain increases charge carrier mobility in an n-type metal oxide semiconductor field effect transistor (NMOS).

During FinFET manufacture, an individual fin may be cut or severed to define distinct regions that may be used to form independent devices. Such a process typically involves etching unwanted portions of a fin to form a cut region, and backfilling the cut region with a dielectric material to isolate the remaining active regions of the fin on either side of the cut region. The resulting structure may be referred to as a single diffusion break (SDB), insomuch as the backfilled isolation dielectric defines a single region that prevents unwanted current flow between the two active fins that adjoin the SDB isolation structure. As will be appreciated, however, severing of the fin may have the undesired effect of relaxing the strain within the remaining portions of the fin.

SUMMARY

Accordingly, it would be advantageous to provide a method for forming a single diffusion break structure within a semiconductor fin that avoids decreasing the strain within the remaining active regions of fin while providing the requisite isolation therebetween. In accordance with various embodiments, in lieu of removing portions of the fin and backfilling the removed portions with an isolation dielectric, the fin itself is locally oxidized to form a single diffusion break structure.

According to certain embodiments, a method of forming a device including forming a fin over a semiconductor substrate, forming a sacrificial gate structure over the fin, and forming an interlayer dielectric over the sacrificial gate structure. The interlayer dielectric is then planarized to expose the sacrificial gate structure.

A mask layer is formed over the interlayer dielectric and above the sacrificial gate structure, and a first opening is formed in the mask layer to expose a portion of the sacrificial gate structure. A portion of the sacrificial gate structure is then removed to define a second opening and expose a portion of the fin. A single diffusion break structure is formed by oxidizing the exposed portion of the fin, and forming a dielectric layer over the oxidized fin.

A further method includes forming a plurality of fins over a semiconductor substrate, forming a sacrificial gate structure over the fins, forming an interlayer dielectric over the sacrificial gate structure and planarizing the interlayer dielectric to expose the sacrificial gate structure. A mask layer is formed over the interlayer dielectric and above the sacrificial gate structure, and an opening is formed in the mask layer to expose a portion of the fins. The exposed portion of the fins is oxidized and a dielectric layer is formed over the oxidized portion of the fins.

According to further embodiments, a device structure includes a first portion of a first fin disposed over a semiconductor substrate, and a second portion of the first fin disposed over the semiconductor substrate and separated from the first portion of the first fin by a single diffusion break structure, where the single diffusion break structure includes an oxidized portion of the first fin.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 4A shows the deposition of an isolation dielectric within the gate cut region over STI;

FIG. 4B shows the deposition of an isolation dielectric within the gate cut region;

FIG. 5C is a cross-sectional view along the line Y2 of FIG. 1 showing patterning and etching to expose the sacrificial gate within the fin cut region;

FIG. 6A shows the isolation dielectric disposed within the gate cut region over STI and the fin cut mask layer disposed over the isolation dielectric;

FIG. 6B is a cross-sectional view through a fin showing the structure of FIG. 5B following selective removal of the sacrificial gate from over the fin within the fin cut region;

FIG. 6C depicts the structure of FIG. 5C after removal of the sacrificial gate from within the fin cut region;

FIG. 7A shows the isolation dielectric disposed within the gate cut region over STI and the fin cut mask layer disposed over the isolation dielectric;

FIG. 7B is a cross-sectional view through a fin following a recess etch of the isolation dielectric and the STI layer within the fin cut region;

FIG. 7C shows recessing of the isolation dielectric and STI layers to expose upper and middle portions of the fins;

FIG. 8A shows the isolation dielectric disposed within the gate cut region over STI and the fin cut mask layer disposed over the isolation dielectric;

FIG. 8B shows localized oxidation of the fin within the fin cut region;

FIG. 8C depicts the oxidation of exposed portions of the fins within the fin cut region;

DETAILED DESCRIPTION

Figure 2A:
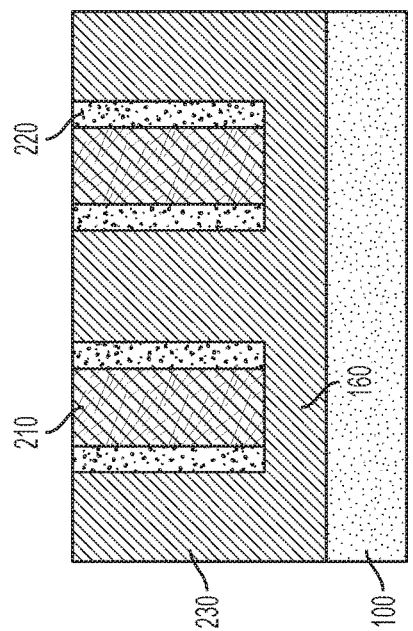
FIG. 2A is a cross-sectional view along the line X1 of FIG. 1 through a gate cut region of the device architecture located over a shallow trench isolation (STI) layer between neighboring active regions.

Reference will now be made in greater detail to various embodiments of the subject matter of the present application, some embodiments of which are illustrated in the accompanying drawings. The same reference numerals will be used throughout the drawings to refer to the same or similar parts.

The various components and layers of the structures disclosed herein may be formed using a variety of different materials and methods, e.g., a chemical vapor deposition (CVD) process, an atomic layer deposition (ALD) process, a thermal growth process, spin-coating techniques, etc. The thicknesses of these various layers of material may vary depending upon the particular application.

Figure 1:
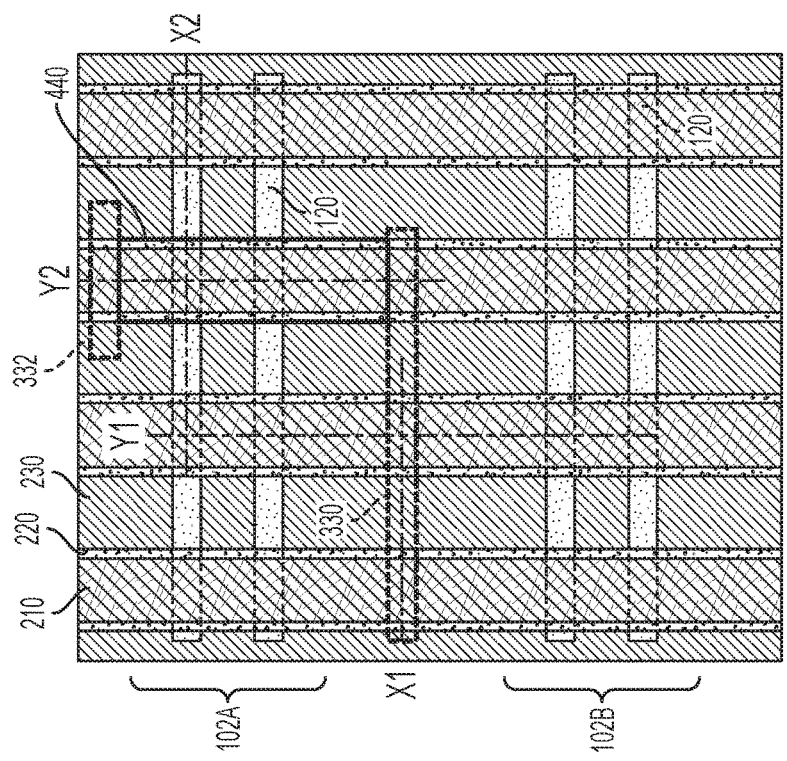
FIG. 1 is a schematic layout of a FinFET architecture showing gate cut and fin cut regions prior to removal of a sacrificial gate.

Referring to FIG. 1, a schematic top-down plan view layout of a FinFET architecture at an intermediate stage of fabrication includes a plurality of semiconductor fins 120 arrayed over a semiconductor substrate (not shown). According to various embodiments, a first plurality of fins 120 define a first active area 102A proximate to the first plurality of fins within a first region of the substrate, and a second plurality of fins 120 define a second active area 102B proximate to the second plurality of fins within a second region of the substrate. As will be readily apparent to those skilled in the art, the methods and structures disclosed herein may be employed in manufacturing a variety of different devices, including, but not limited to, logic devices, memory devices, etc., and the devices may be may be either PMOS or NMOS devices.

For instance, a p-type device may be formed within the first active area 102A and an n-type device may be formed within the second active area 102B.

Figure 2B:
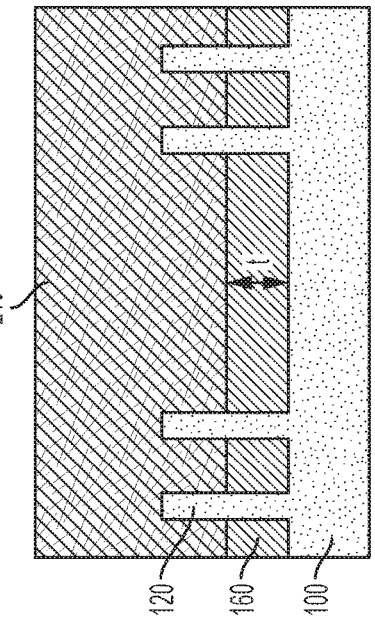
FIG. 2B is a cross-sectional view along the line Y1 of FIG. 1 showing the sacrificial gate disposed over plural semiconductor fins.

With reference also to the cross-sectional views of FIG. 2A and FIG. 2B, a sacrificial gate structure, including a sacrificial gate 210 and spacer layers 220 disposed over sidewalls of the sacrificial gate, overlies the fins 120 within each active area 102A, 102B and extends over shallow trench isolation 160 located between the active areas.

Semiconductor substrate 100 may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may include other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Substrate 100 may be a bulk substrate or a composite substrate such as a semiconductor-on-insulator (SOI) substrate that includes, from bottom to top, a handle portion, an isolation layer (e.g., buried oxide layer), and a semiconductor material layer.

Substrate 100 may have dimensions as typically used in the art and may include, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may be a (100)-oriented silicon wafer or a (111)-oriented silicon wafer, for example.

In various embodiments, fins 120 include a semiconductor material such as silicon, and may be formed by patterning and then etching the semiconductor substrate 100, e.g., a top portion of the semiconductor substrate. In several embodiments, the fins 120 are etched from, and therefore contiguous with the semiconductor substrate 100. For instance, fins 120 may be formed using a sidewall image transfer (SIT) process as known to those skilled in the art.

In certain embodiments, the fins 120 can have a width of 5 nm to 20 nm, and a height of 40 nm to 150 nm, although lesser and greater dimensions are also contemplated. Fins 120 may be arrayed on the semiconductor substrate at a regular intra fin spacing or pitch. As used herein, the term "pitch" refers to the sum of the fin width and the spacing between neighboring fins. In example embodiments, the fin pitch may be 20 to 100 nm, e.g., 20, 30, 40, 50, 60, 70, 80, 90 or 100 nm, including ranges between any of the foregoing values, although smaller and larger pitch values may be used.

After fin formation, a fin cut or fin removal process may be used to eliminate unwanted fins or unwanted portions thereof for the particular circuit or device being fabricated. Thus, the fin-to-fin periodicity may be constant or variable over an array of fins. As will be appreciated by those skilled in the art, the semiconductor fins 120 are typically arranged in parallel and are laterally isolated from each other by shallow trench isolation layer 160.

Shallow trench isolation (STI) layer 160 may be used to provide electrical isolation between the fins 120 and between adjacent devices as is needed for the circuit(s)

being implemented. An STI process for FinFET devices involves creating isolation trenches in the semiconductor substrate 100 through an anisotropic etch process. The isolation trench between each adjacent fin may have a relatively high aspect ratio (e.g., ratio of the depth of the isolation trench to its width). A dielectric fill material, such as silicon dioxide, is deposited into the isolation trenches, for example, using an enhanced high aspect ratio process (eHARP) to fill the isolation trenches. The deposited dielectric material may then be polished by a chemical-mechanical polishing (CMP) process that removes the excess dielectric material and creates a planar STI structure.

"Planarization" and "planarize" as used herein refer to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

In certain embodiments, as shown for example in FIG. 2B, the planarized STI oxide is etched back to form a recessed, uniformly thick (t) oxide isolation layer 160 between the fins 120, where upper sidewalls of the fins 120 can be exposed for further processing.

Still referring to FIG. 2B, a conformal layer of amorphous silicon is formed over the fins 120 and over exposed portions of the STI layer 160 and patterned using conventional lithography to form a sacrificial gate 210. The conformal layer of amorphous silicon may have a thickness sufficient to completely cover the fins. For instance, a thickness of conformal layer of amorphous silicon may range from 50 to 200 nm, e.g., 50, 75, 100, 125, 150, 175 or 200 nm, including ranges between any of the foregoing values, although lesser and greater thicknesses may be used. The sacrificial gate 210 overlies channel regions of the fins 120. In certain embodiment, a thin dielectric layer such as a layer of silicon dioxide (not shown) may be formed over the fins to separate the fins from the amorphous silicon 210.

Sidewall spacers 220 are formed over sidewalls of the sacrificial gate 210. Sidewall spacers 220 may be formed by blanket deposition of a spacer material (e.g., using atomic layer deposition) followed by a directional etch such as reactive ion etching (RIE) to remove the spacer material from horizontal surfaces. Sidewall spacers 220 may include silicon nitride, for example.

As used here, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space.

Figure 5B:
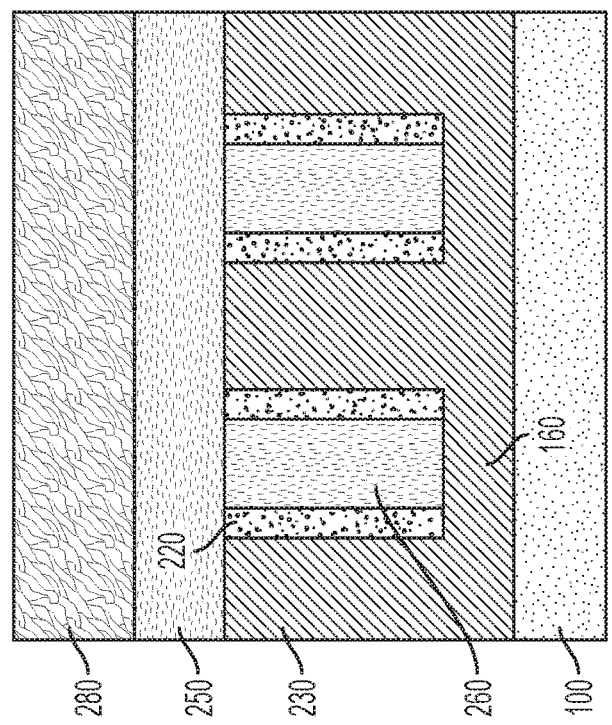
FIG. 5B is a cross-sectional view along the line X2 of FIG. 1 showing the structure following the formation of epitaxial source/drain regions and an etching step to expose the sacrificial gate within the fin cut region.

After formation of the sacrificial gate 210 and sidewalls spacers 220, source/drain regions 510 may be formed by ion implantation or selective epitaxy at self-aligned locations between adjacent sacrificial gates 210, e.g., using the sidewall spacers 220 as an alignment mask. According to exemplary embodiments, source/drain regions 510 may be formed by selective epitaxial growth from exposed portions of the semiconductor fins 120. The cross-sectional view of FIG. 5B shows the formation of source/drain regions 510 over source/drain regions of a fin 120.

As used herein, the terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation. Source/drain regions 510 may include silicon, silicon germanium, or another suitable semiconductor material.

The selective epitaxy process deposits an epitaxial layer directly onto the exposed surfaces of the fins 120 adjacent to the sidewall spacers 220. Exposed surfaces of the fins 120 may include the top surface as well as upper portions of the sidewalls of the fins proximate to the top surface. In various embodiments, a silicon epitaxial layer is formed without deposition of silicon on the exposed dielectric surfaces. Selective epitaxial layers may be formed using molecular beam epitaxy or chemical vapor deposition processes that are adapted for selective epitaxy.

An example silicon epitaxial process for forming source/drain regions 510 uses a gas mixture including $H_2$ and dichlorosilane ($SiH_2Cl_2$) at a deposition (e.g., substrate) temperature of 600-800° C. Other suitable gas sources for silicon epitaxy include silicon tetrachloride ($SiCl_4$), silane ($SiH_4$), trichlorosilane ($SiHCl_3$), and other hydrogen-reduced chlorosilanes ($SiH_xCl_{4-x}$).

Referring to FIGS. 1 and 2A, after forming source/drain regions 510, an interlayer dielectric 230 is deposited directly over the epitaxial layers to fill the openings between adjacent sacrificial gates 210. The interlayer dielectric 230 may include silicon dioxide and may be formed by chemical vapor deposition or atomic layer deposition. The overburden may be removed by chemical mechanical polishing using the sacrificial gate and the sidewall spacers as a CMP stop layer.

In various embodiments, the amorphous silicon layer serves as a stopping layer for the planarization process, such that polishing of the interlayer dielectric 230 exposes a top surface of the sacrificial gates 210, as illustrated in FIGS. 1 and 2A.

Referring again to FIG. 1, gate cut regions 330, 332 are located outside of the active areas 102A, 102B, i.e., over STI 160, and represent the regions where selected sacrificial gates 210 will be severed and replaced with an etch selective material in order to isolate later-formed functional gates. Shown also in FIG. 1 is fin cut region 440, where selected fins will be locally oxidized to form a single diffusion break according to exemplary embodiments. In the illustrated embodiment, gate cut regions 330, 332 abut respective opposing ends of fin cut region 440. In example processes, the formation of a gate cut, i.e., by etching the sacrificial gate 210 to form a gate cut opening, and back-filling the gate cut opening with an isolation dielectric, precedes the formation of a single diffusion break by localized oxidation of a fin. Example methods of forming a FinFET structure including locally oxidized fins are described with particular reference to FIGS. 3A-9C. As described further below, FIGS. 3A-9C are cross-sectional views taken with respect to various reference lines X1, X2, Y1 and Y2, as annotated in FIG. 1

In FIG. 1, reference line X1 is taken through the gate cut region 330 of the architecture between active areas 102A, 102B, i.e., over shallow trench isolation. Reference line Y1 is taken through a sacrificial gate 210 and traverses the first active area 102A, an isolation region including the gate cut region 330, and the second active area 102B. Reference line X2 is taken along a fin 120 within the first active area 102A and crosses fin cut region 440, while reference line Y2 is taken along a sacrificial gate 210 within the first active area 102A, and through the fin cut region 440. With reference to the schematic layout of FIG. 1, FIGS. 2A-9A depict cross-sectional views along line X1, FIGS. 2B-4B are cross-sectional views along the line Y1, FIGS. 5B-9B are cross-sectional views along the line X2, and FIGS. 5C-9C and 9D are cross-sectional views along the line Y2.

Figure 3B:
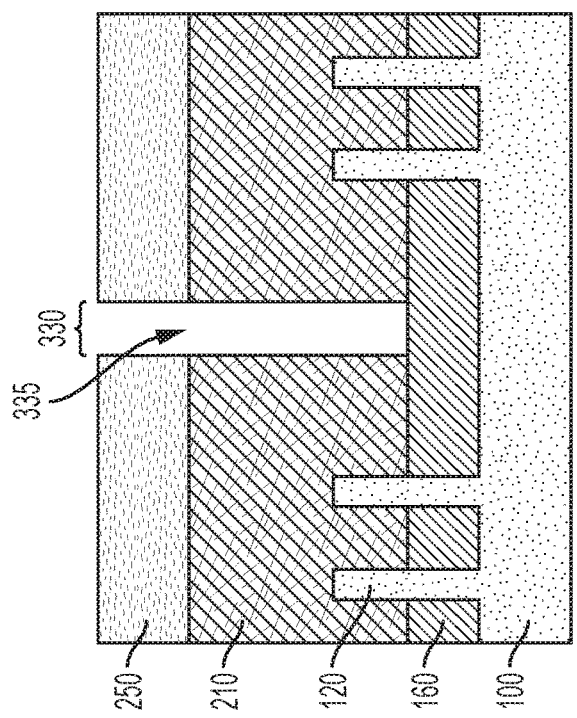
FIG. 3B shows the structure of FIG. 2B following the patterned removal of the sacrificial gate from within a gate cut region.
Figure 3A:
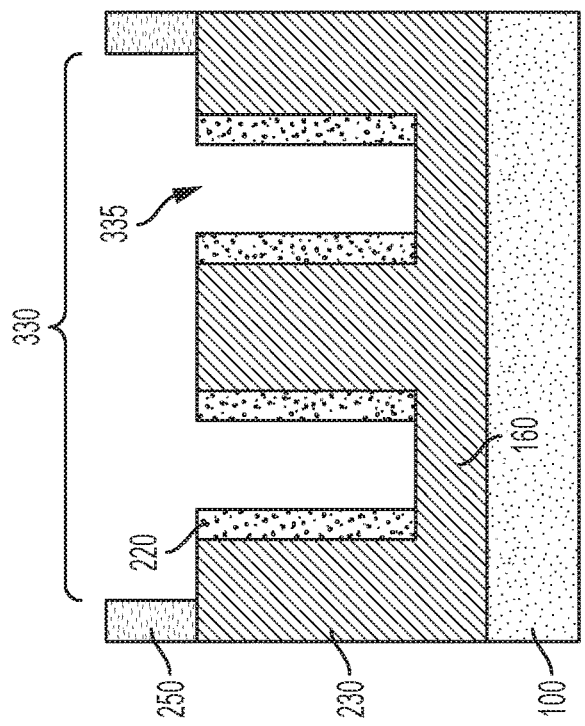
FIG. 3A shows the structure of FIG. 2A following removal of the sacrificial gate from within a gate cut region.

Referring to FIG. 3A and FIG. 3B, a gate cut mask layer 250 is formed over the structures of FIG. 2A and FIG. 2B and, using conventional photolithography, patterned to define gate cut region 330. In an example method, the gate cut mask layer 250 may include silicon nitride. Using the patterned gate cut mask layer 250 as an etch mask, a directional etch such as a reactive ion etch (RIE) is used to remove exposed portions of the sacrificial gate 210 to form gate cut openings 335. STI layer 160 may form a bottom surface of the gate cut openings 335.

Referring to FIG. 4A and FIG. 4B, the gate cut openings 335 are backfilled with a isolation dielectric layer 260. According to various embodiments, the isolation dielectric layer 260 is formed from a material that is etch selective to amorphous silicon, i.e., etch selective to the sacrificial gate 210. In various embodiments, isolation dielectric layer 260 may include silicon nitride. A CMP step may be used to planarize the structure.

Figure 5A:
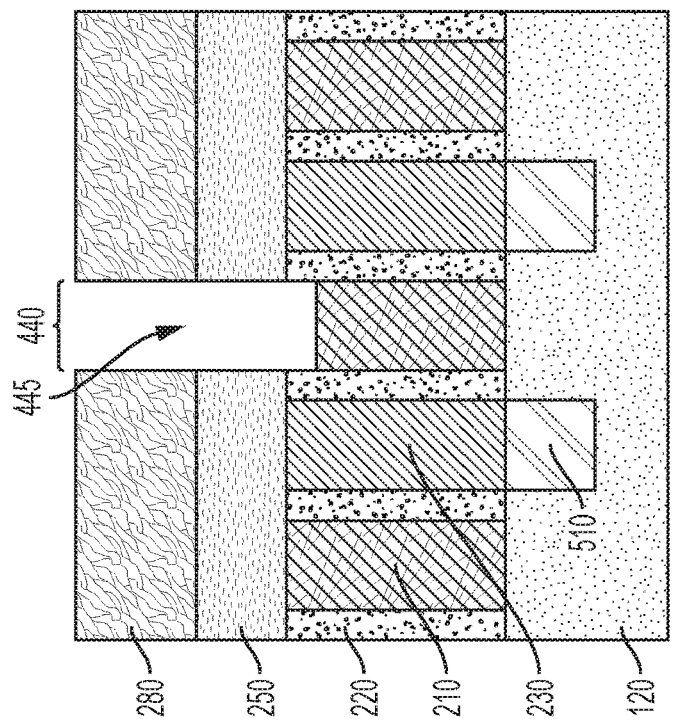
FIG. 5A shows the isolation dielectric disposed within the gate cut region over STI and a fin cut mask layer disposed over a gate cut mask.

Referring to FIG. 5A, FIG. 5B and FIG. 5C, a fin cut mask layer 280 is formed over the backfilled gate cut mask 250, i.e., directly over the gate cut mask 250 and the isolation dielectric 260 and, using conventional photolithography, patterned to define fin cut region 440. In example methods, the fin cut mask layer 280 may include an organic material such as photoresist or amorphous carbon. Using the patterned fin cut mask layer 280 as an etch mask, a directional etch such as a reactive ion etch (RIE) is used to remove portions of the gate cut mask 250 and expose a top surface of the sacrificial gate 210 within fin cut opening 445.

Referring to FIG. 6B and FIG. 6C, a further etching step is used to remove the sacrificial gate 210 within the fin cut opening 445 to expose STI layer 160 and upper portions of fins 120. With reference to FIGS. 6B and 6C, in the illustrated embodiment, along the length dimension of the fin 120, the fin cut opening 445 is bounded by sidewall spacers 220, while along a width dimension of the fins, the fin cut opening is bounded by isolation dielectric 260. With reference to FIG. 6A, it will be appreciated that within the gate cut region 330 the structure may be substantially unaffected by the formation of the fin cut opening.

Referring to FIG. 7A and FIG. 7B, and in particular FIG. 7C, a pulldown etch of the STI layer 160 within fin cut region 440, i.e., within fit cut opening 445, is used to expose the upper and middle portions of the fins 120. As will be appreciated, the extent to which the STI layer 160 is recessed may vary depending on the particular application. According to various embodiments, the pull-down etch may expose 50 to 100% of the height of the fins within the fin cut region 440.

Referring to FIG. 8B and FIG. 8C, portions of the fins 120 that are exposed within the fin cut region 440 are then oxidized. In example embodiments, a fin 120 within the fin cut region 440 may be completely oxidized, i.e., through an entirety of its thickness, to form a silicon dioxide fin 122. The oxidized portion of each fin 120 forms a single diffusion break in situ, without causing substantial strain relaxation in adjacent, un-oxidized portions of the semiconductor fin. At this stage of manufacture, the structure within the gate cut region 330 may remain substantially unaffected (FIG. 8A).

An example process that may be used to oxidize an exposed portion of a semiconductor fin 120 may be a thermal process, during which the fin 120 may be exposed to an oxidizing environment containing an oxidizing species such as oxygen, ozone, nitrogen monoxide, nitrogen dioxide, carbon dioxide and/or water vapor (steam) at a temperature of 500 to 1000° C. As will be appreciated with reference to FIGS. 8A-8C, the oxidation process may remove fin cut mask layer 280, of the fin cut mask layer 280 may be removed prior to the oxidation process.

In accordance with various embodiments, performing a single diffusion break by localized oxidation of the semi-conductor fin results in no appreciable strain relaxation of remaining portions (i.e., semiconductor portions) of the fin 120 adjacent to the oxidized region. As used herein, "no appreciable strain relaxation" means a decrease in strain within portions of the semiconductor fin 120 adjacent to the single diffusion break structure of 10% or less, e.g., less than 10, 5, 2, 1, or 0.1%, including ranges between any of the foregoing values. By comparison, in conventional structures having a single diffusion break formed by etching portions of the fin and backfilling the etched portions with a dielectric material, the strain loss in remaining portions of the fin, e.g., adjacent to the single diffusion break, may be 20% or more. In an example structure, Applicant has found that after performing a single diffusion break by located oxidation, a measured difference between the lattice constant of a silicon fin 120 and an underlying silicon substrate along the {002} direction is about 0.9%, and the measured difference between the lattice constant of the silicon fin and the underlying silicon substrate along the {220} direction is 0%.

Referring to FIGS. 9A-9D, the fin cut opening 445 is filled with a capping layer 470 and polished. The capping layer 470 may include CVD or ALD silicon nitride. A polishing process to remove capping layer 470 may also remove portions of the gate cut mask 250 over the interlayer dielectric 230, where the sacrificial gate 210 may serve a CMP stopping layer.

Figure 9B:
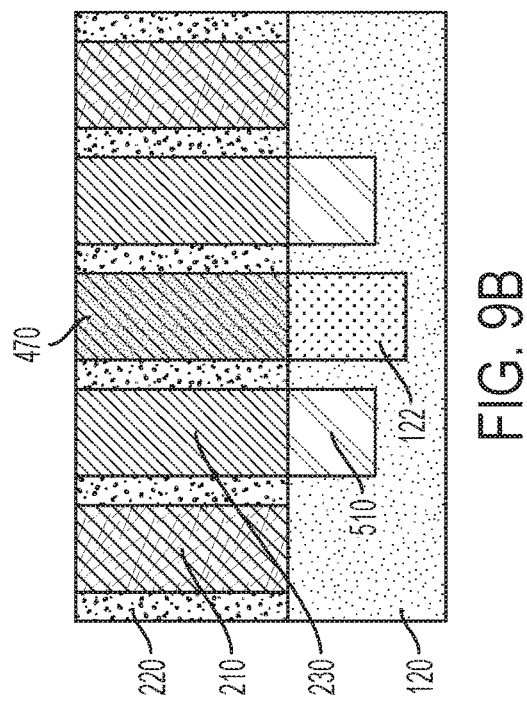
FIG. 9B shows deposition of a nitride capping layer over the oxidized region of the fin.
Figure 9A:
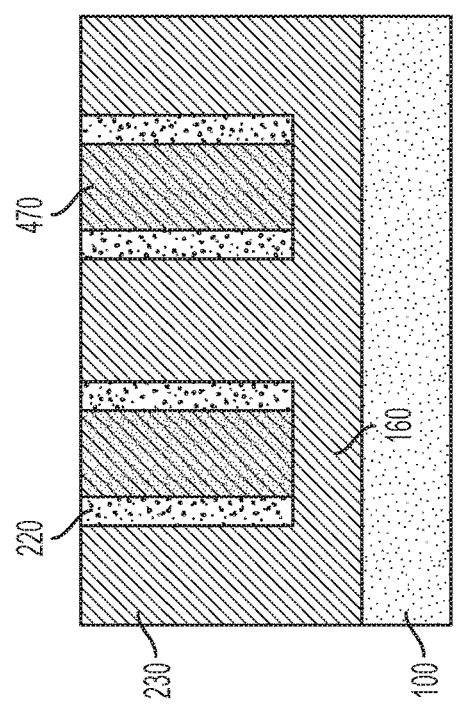
FIG. 9A shows the post-CMP removal of the fin cut mask.
Figure 9C:
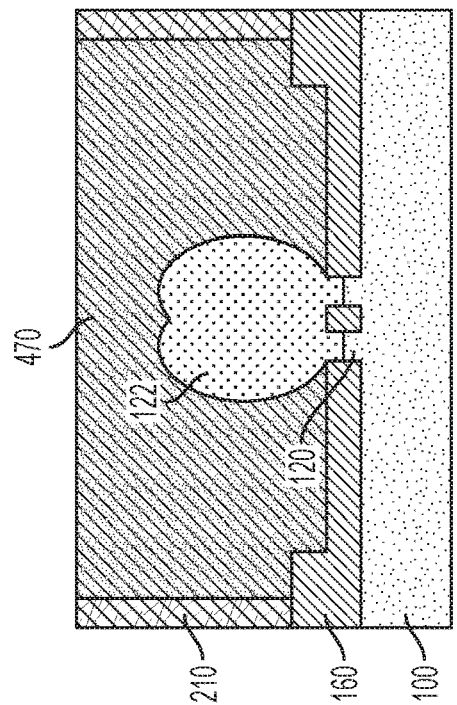
FIG. 9C shows deposition of a nitride capping layer over the oxidized fins.

Referring to FIG. 9C, and in accordance with various embodiments, in the illustrated cross-section, which is taken along the length of the sacrificial gate 210, i.e., orthogonal to a length direction of the fins 120, the fin cut region 440 includes capping layer 470 and the oxidized portions 122 of the fins 120. That is, single diffusion break structure includes both the nitride capping layer 470 and the oxidized portion 122 of a fin 120, which are disposed directly over STI 160.

Figure 9D:
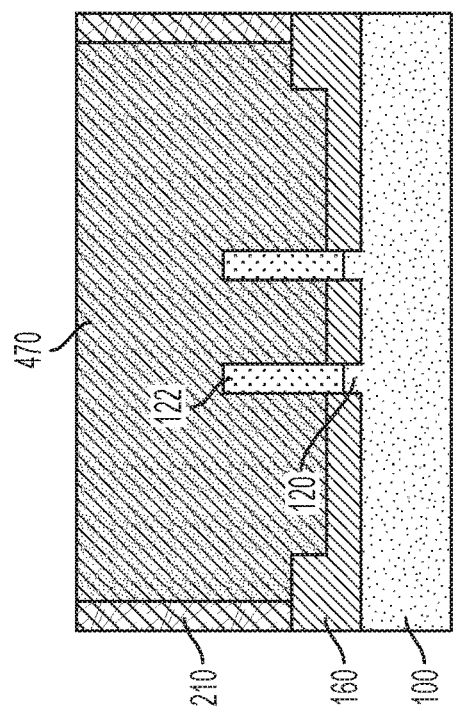
FIG. 9D shows deposition of a nitride capping layer over merged oxidized regions of the fins.

FIG. 9D shows an alternate structure to that of FIG. 9C. In FIG. 9D, due to a volume expansion associated with oxidation of the fin within the fin cut region, the oxidized portions 122 of adjacent fins may merge. In such a structure, as with the structure of FIG. 9C, the single diffusion break structure includes both the nitride capping layer 470 and the oxidized portion 122 of a fin 120 disposed directly over STI 160.

Disclosed is a methodology for forming a single diffusion break structure using localized, in situ oxidation of a portion of a semiconductor fin. Fin oxidation within a fin cut region may be preceded by the formation of epitaxial source/drain regions over the fin, as well as by a gate cut module, where portions of a sacrificial gate that straddle the fin are replaced by an isolation layer. Localized oxidation of the fin enables the stress state in adjacent, un-oxidized portions of the fin to be retained, which may beneficially impact carrier mobility and hence conductivity within channel portions of the fin.

As used herein, the singular forms "a," "an" and "the" include plural referents unless the context clearly dictates otherwise. Thus, for example, reference to a "semiconductor fin" includes examples having two or more such "semiconductor fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to an oxidized portion of a fin that comprises silicon dioxide include embodiments where an oxidized portion of a fin consists essentially of silicon dioxide and embodiments where an oxidized portion of a fin consists of silicon dioxide.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a device, comprising:
   forming a plurality of fins over a semiconductor substrate;
   forming a sacrificial gate structure over the fins;
   forming an interlayer dielectric over the sacrificial gate structure;
   planarizing the interlayer dielectric to expose the sacrificial gate structure;
   forming a mask layer over the interlayer dielectric and above the sacrificial gate structure;
   forming an opening in the mask layer to expose a portion of the fins;
   oxidizing at least an entire cross-section of the exposed portion of the fins above the semiconductor substrate to form a single diffusion break (SDB) layer on an entire surface of the fins, wherein each SDB layer electrically separates a first portion of each fin from a second portion of each fin horizontally opposite the SDB layer; and
   forming a dielectric layer over the fins after forming the SDB layer on the entire surface of each fin.

2. The method of claim 1, further comprising forming a shallow trench isolation layer over the semiconductor substrate and over sidewalls of the fins.

3. The method of claim 2, further comprising recessing the shallow trench isolation layer to increase a thickness of the exposed portion of the fins prior to oxidizing the fins.

4. The method of claim 1, wherein oxidizing the fins comprises oxidizing an entire thickness of the fin.

5. A method of forming a device, comprising:
   forming a fin over a semiconductor substrate;
   forming a sacrificial gate structure over the fin;
   forming an interlayer dielectric over the sacrificial gate structure;
   planarizing the interlayer dielectric to expose the sacrificial gate structure;
   forming a mask layer over the interlayer dielectric and above the sacrificial gate structure;
   forming a first opening in the mask layer to expose a portion of the sacrificial gate structure;
   removing the portion of the sacrificial gate structure to define a second opening and expose a portion of the fin;
   oxidizing at least an entire cross-section of the exposed portion of the fin above the semiconductor substrate to form a single diffusion break (SDB) layer on an entire surface the fin, wherein the SDB layer electrically isolates a first portion of the fin adjacent the SDB layer from a second portion of the fin adjacent a horizontally opposite side of the SDB layer; and
   forming a dielectric layer over the SDB layer on the entire surface of the fin.

6. The method of claim 5, further comprising forming a shallow trench isolation layer over the semiconductor substrate and over sidewalls of the fin.

7. The method of claim 6, further comprising recessing the shallow trench isolation layer to increase a thickness of the exposed portion of the fin prior to oxidizing the fin.

8. The method of claim 5, wherein oxidizing the fin comprises oxidizing an entire thickness of the fin.

9. The method of claim 5, wherein the dielectric layer substantially fills the first and second openings.

10. The method of claim 5, wherein the oxidized portion of the fin comprises silicon dioxide and the dielectric layer comprises silicon nitride.

* * * * *